(12) United States Patent
Akarvardar et al.

(10) Patent No.: US 9,252,245 B1
(45) Date of Patent: Feb. 2, 2016

(54) SPACER-LAST REPLACEMENT METAL GATE FLOW AND DEVICE

(71) Applicant: GLOBALFOUNDRIES Inc., Grand Cayman (KY)

(72) Inventors: Murat Akarvardar, Saratoga Springs, NY (US); Rama Kambhampati, Guilderland, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/478,494

(22) Filed: Sep. 5, 2014

(51) Int. Cl.
| | |
|---|---|
| *H01L 29/66* | (2006.01) |
| *H01L 27/088* | (2006.01) |
| *H01L 21/3065* | (2006.01) |
| *H01L 21/306* | (2006.01) |
| *H01L 29/45* | (2006.01) |
| *H01L 21/3105* | (2006.01) |
| *H01L 21/283* | (2006.01) |

(52) U.S. Cl.
CPC .......... *H01L 29/6681* (2013.01); *H01L 21/283* (2013.01); *H01L 21/3065* (2013.01); *H01L 21/30604* (2013.01); *H01L 21/31053* (2013.01); *H01L 29/45* (2013.01)

(58) Field of Classification Search
CPC ............ H01L 29/785; H01L 29/66545; H01L 21/28088; H01L 29/517; H01L 21/28008; H01L 29/4966
USPC ........................................... 438/591; 257/410
See application file for complete search history.

(56) References Cited

U.S. PATENT DOCUMENTS

| | | | |
|---|---|---|---|
| 2013/0026578 A1* | 1/2013 | Tsau ............................. | 257/368 |
| 2013/0032876 A1* | 2/2013 | Cheng et al. .................. | 257/327 |

* cited by examiner

*Primary Examiner* — Evan Pert
*Assistant Examiner* — Changhyun Yi
(74) *Attorney, Agent, or Firm* — Ditthavong & Steiner, P.C.

(57) ABSTRACT

A methodology for spacer-last replacement metal gate (RMG) flow that exhibits reduced variability, and the resulting device are disclosed. Embodiments may include forming a dummy gate stack comprising a dummy nitride portion on a dummy oxide portion on a substrate, forming source/drain regions in the substrate at opposite sides of the dummy gate stack, depositing an insulating material over the source/drain regions, coplanar with the dummy gate stack, and replacing the dummy gate stack with a metal gate stack and spacers.

20 Claims, 8 Drawing Sheets

SPACER-LAST REPLACEMENT METAL GATE FLOW AND DEVICE

TECHNICAL FIELD

The present disclosure relates to the fabrication of semiconductor devices based on a replacement metal gate (RMG) process. The present disclosure particularly relates to RMG processing in 14 nm technology nodes and beyond.

BACKGROUND

A conventional RMG process flow typically involves separate stages for gate processing, source/drain processing, and contact formation. The number of stages in such complex integration flows jeopardizes process uniformity and device yield. For instance, a conventional RMG front-end flow for a fin field effect transistor (FINFET) may include (i) a fin and shallow trench isolation (STI) module, (ii) a dummy gate module, (iii) a spacer module, (iv) source/drain processing steps, (v) an insulator encapsulation step followed by a poly exposure and pull step (hereinafter referred to as Poly-Open-Chemical-Mechanical-Polishing (Poly-Open-CMP) module), and (vii) a replacement high-K/metal gate (HK/MG) module. The integration of each module becomes more challenging in each node due to scaling according to Moore's Law. The incorporation of new performance elements such as a low-K dielectric spacer tends to make the integration even more complex from one technology node to the next. In particular, the need for gate length scaling increases the complexity of RMG module substantially along with the engineering of various metal gate stacks with appropriate work function.

A need therefore exists for methodology enabling a simplified and robust RMG process integration with reduced variability.

SUMMARY

An aspect of the present disclosure is to employ a nitride dummy gate instead of the conventional poly silicon dummy gate.

Another aspect of the present disclosure is forming nitride gate spacers after removal of the nitride dummy gate.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a dummy gate stack including a dummy nitride portion on a dummy oxide portion on a substrate, forming source/drain regions in the substrate at opposite sides of the dummy gate stack, depositing an insulating material over the source/drain regions, coplanar with the dummy gate stack, and replacing the dummy gate stack with a metal gate stack and spacers.

Aspects of the present disclosure include forming the spacers between the metal gate stack and the insulating material. Additional aspects include the substrate being a fin for a FINFET. Further aspects include replacing the dummy gate stack by removing the dummy nitride portion with reactive ion etching (RIE). Additional aspects include using hot phosphorus for the RIE. Further aspects include forming the source/drain regions by forming a recess in the substrate on each side of the dummy gate stack and epitaxially growing a silicon-based material in and over each recess. Additional aspects include forming the dummy gate stack by forming a dummy oxide layer on the substrate, forming a dummy nitride layer on the dummy oxide layer, and patterning the nitride layer and the dummy oxide layer with RIE. Further aspects include forming the dummy oxide layer to a thickness ranging from 3 to 10 nm. Additional aspects include forming the dummy nitride layer to a thickness ranging from 50 to 150 nm. Further aspects include a critical dimension (CD) of the dummy gate stack being greater than a CD of the metal gate stack. Additional aspects include replacing the dummy gate stack with the metal gate stack by removing the dummy nitride portion of the dummy gate stack to form a trench in the deposited insulating material, forming the spacers on sidewall surfaces of the trench, removing the dummy oxide portion of the dummy gate stack, forming a HK dielectric layer over the spacers and a bottom surface of the trench, forming a work function metal layer over the HK dielectric layer, and depositing a gate metal in the trench.

Another aspect of the present disclosure is a method including: forming a dummy oxide layer directly on an upper surface of a substrate, forming a dummy nitride layer directly on the dummy oxide layer, patterning the dummy nitride and dummy oxide layers to form a dummy gate stack having dummy nitride and dummy oxide portions, forming source/drain regions at opposite sides of the dummy gate stack, and replacing the dummy gate stack with a metal gate stack. Additional aspects include forming the dummy nitride layer to a thickness ranging from 50 to 150 nm and the dummy oxide layer to a thickness ranging from 3 to 10 nm. Further aspects include the substrate including a fin structure for a FINFET. Additional aspects include forming the source/drain regions by forming a recess in the substrate on each side of the dummy gate stack, and epitaxially growing a silicon-based material in and over each recess. Further aspects include replacing the dummy gate stack with the metal gate stack by depositing an insulating layer to cover the dummy gate stack and the source/drain regions, planarizing the insulating layer down to an upper surface of the nitride portion, removing the dummy nitride portion of the dummy gate stack to expose an upper surface of the dummy oxide portion, forming a trench in the insulating layer, conformally forming a spacer layer over the insulating layer and in the trench, removing the spacer layer from the upper surface of the dummy oxide portion and from an upper surface of the insulating layer, leaving spacers on side surfaces of the trench, removing the dummy oxide portion, and forming a replacement metal gate in a remaining space of the trench. Additional aspects include planarizing by chemical-mechanical polishing (CMP). Further aspects include removing the dummy nitride portion by RIE utilizing hot phosphorous. Additional aspects include removing the spacer layer and dummy oxide portion by wet or dry etching.

Aspects include a method including: forming a dummy gate stack by forming a dummy oxide layer on the substrate, forming a dummy nitride layer on the dummy oxide layer, and patterning the nitride layer and the dummy oxide layer with RIE; forming source/drain regions in the substrate at opposite sides of the dummy gate stack by forming a recess in the substrate on each side of the dummy gate stack, and epitaxially growing a silicon-based material in and over each recess; depositing an insulating material over the source/drain regions, coplanar with the dummy gate stack; forming the spacers between the metal gate stack and the insulating material; and replacing the dummy gate stack with a metal gate stack and spacers by removing the dummy nitride portion of the dummy gate stack to form a trench in the deposited insulating material, forming the spacers on sidewall surfaces of the trench, removing the dummy oxide portion of the dummy gate stack, forming a HK dielectric layer over the spacers and a bottom surface of the trench, forming a work function metal layer over the HK dielectric layer, and depositing a gate metal in the trench.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of process complexity and variability associated with conventional dummy gate, spacer, POC, and RMG processes and associated integration modules. Specifically, a conventional RMG process utilizes an amorphous silicon (aSi) or poly silicon dummy gate with SiN encapsulation to isolate the aSi during source/drain epi growth. However, spacer processing may cause the aSi line ends to be exposed to epitaxial source/drain processing, resulting in undesirable epi nodules. Conventional spacer processing also results in undesirable increase in the gate CD (also referred to as "CD blow up") attendant upon unintentional exposure and erosion of spacer material during gate processing. In accordance with embodiments of the present disclosure, a dummy gate stack composed of a nitride is used instead of a SiN-encapsulated aSi dummy gate, and spacer processing is postponed to after dummy gate removal.

Methodology in accordance with embodiments of the present disclosure includes forming a dummy gate stack including a dummy nitride portion on a dummy oxide portion on a substrate, forming source/drain regions in the substrate at opposite sides of the dummy gate stack, depositing an insulating material over the source/drain regions, coplanar with the dummy gate stack, and replacing the dummy gate stack with a metal gate stack confined between the spacers formed within the trench after the dummy nitride removal. The resulting metal gate stack is expected to have sharper and more uniform profiles compared to conventional aSi/SiN hard mask RIE. In addition, the RIE process is simplified in the proposed flow.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
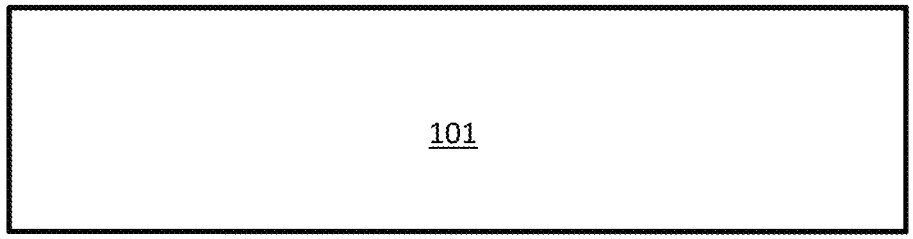
FIGS. 1A through 1O schematically illustrate a spacer-last RMG process, in accordance with an exemplary embodiment.
Figure 1B:
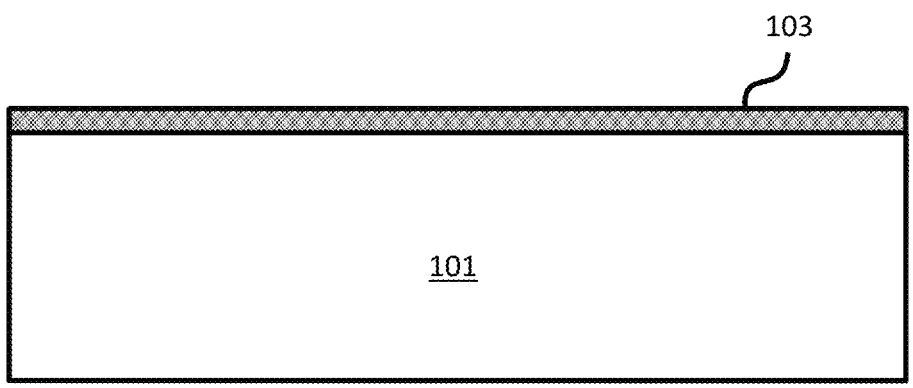

FIGS. 1A through 1O schematically illustrate a spacer-last RMG process, in accordance with an exemplary embodiment. FIG. 1A illustrates a cross-section view of a silicon (Si) substrate 101. The cross-section view may, for instance, be along a fin for a FINFET device. Adverting to FIG. 1B, dummy oxide layer 103 is formed on the surface of substrate 101. Dummy oxide layer 103 may be formed to a thickness ranging from 3 to 10 nm, for example 5 nm.

Figure 1C:
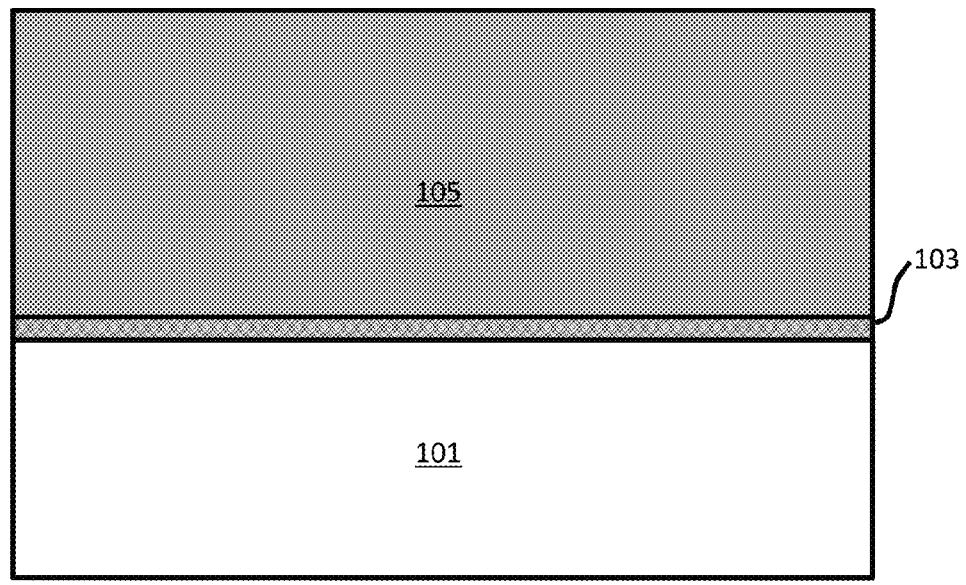

Adverting to FIG. 1C, dummy nitride layer 105 (e.g., silicon nitride (SiN)) is formed on dummy oxide layer 103. Dummy nitride layer 105 may be formed to a thickness ranging from 50 to 150 nm. Dummy nitride layer 105 is the dummy gate material, replacing aSi and SiN hardmask. If this is a FinFET design flow, a planarization (e.g., by CMP) of dummy nitride layer 105 may be performed to achieve a planar nitride surface on the fins.

Figure 1D:
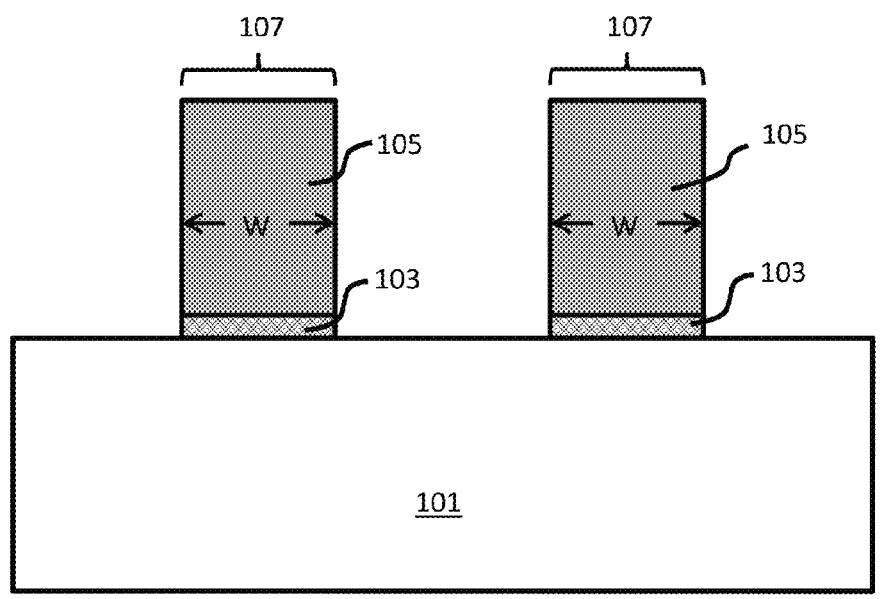
Figure 1E:
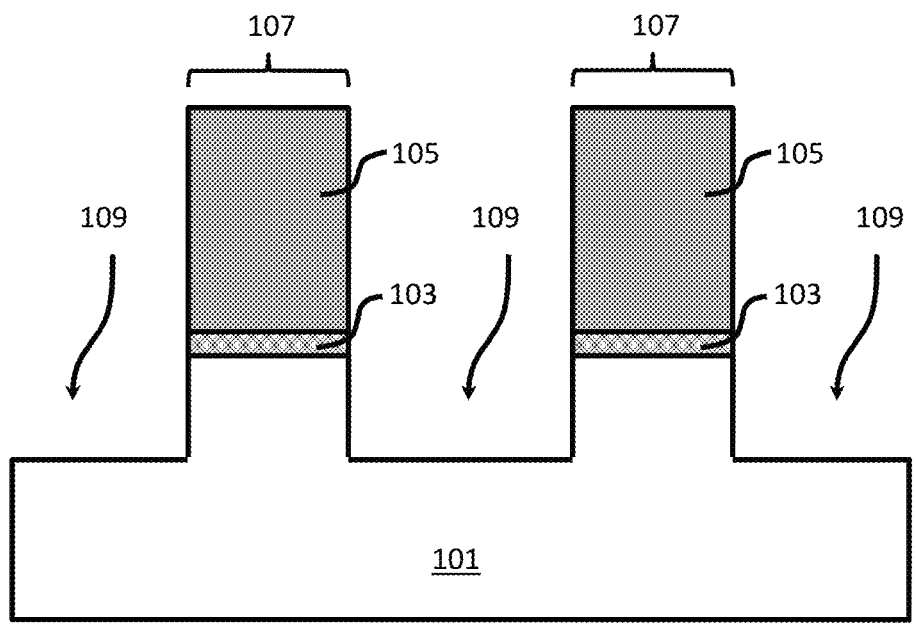

Adverting to FIG. 1D, dummy nitride layer 105 and dummy oxide layer 103 are etched to form dummy gate stacks 107. The width ("W") of each dummy gate stack 107 corresponds to a relaxed gate CD because the width accommodates the width of spacers that will be formed later in the flow after removal of the dummy gate. Adverting to FIG. 1E, substrate 101 is optionally recessed between dummy gate stacks 107 to form recesses 109 in preparation for an embedded epitaxy step associated with source/drain formation. Recesses 109 may be formed to a depth of 0 to 50 nm.

Figure 1F:
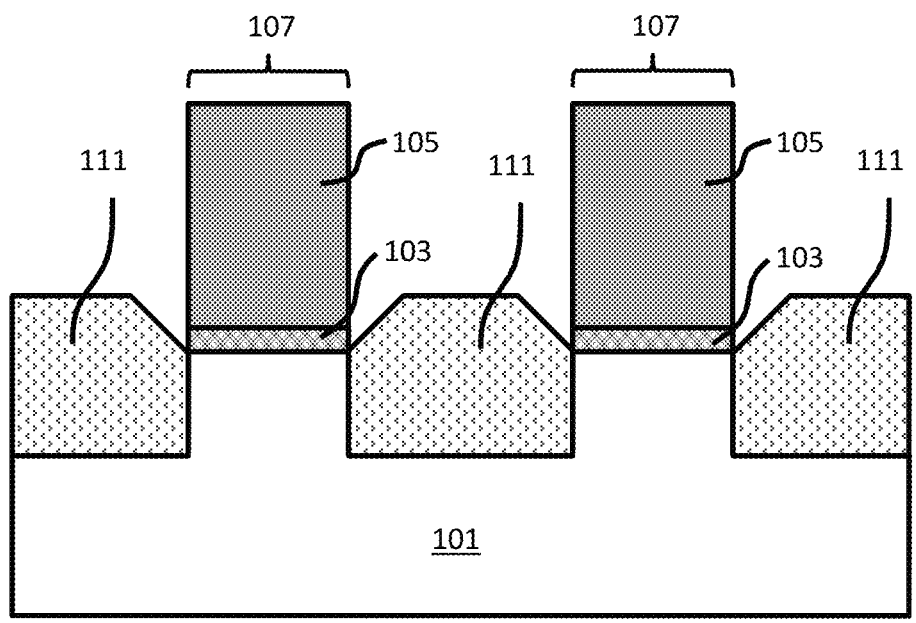

Adverting to FIG. 1F, source/drain regions 111 are formed in recesses 109. By way of example, selective epitaxial growth may be utilized to form source/drain regions 111. As exposed portions of dummy gate stacks 107 are composed of nitride, the formation of epitaxial nodules observed in conventional processing due to exposure of aSi to the epitaxial process is mitigated. Following the epitaxy, the exposed materials are the same as in a conventional RMG process. For instance, the exposed nitride material (from dummy nitride layer 105) of dummy gate stacks 107 is the same as that of a SiN-encapsulated aSi dummy gate in a conventional process. Accordingly, the same block mask and source/drain epitaxial processes may be utilized without modification. However, unlike a conventional process, the spacer module of the design flow that would normally precede the source-drain formation is skipped.

Figure 1G:
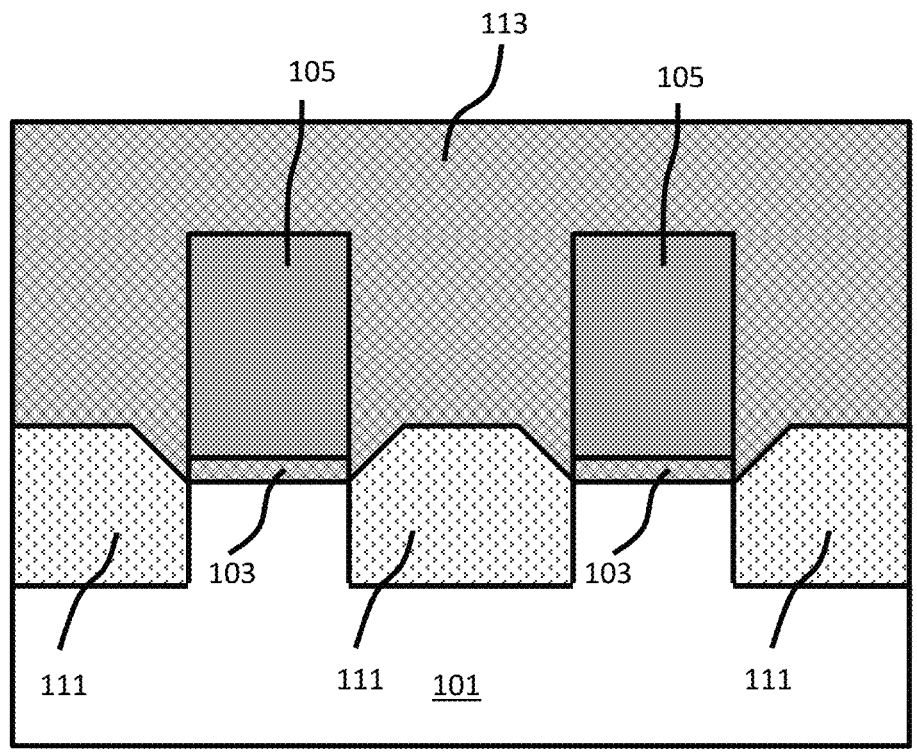
Figure 1H:
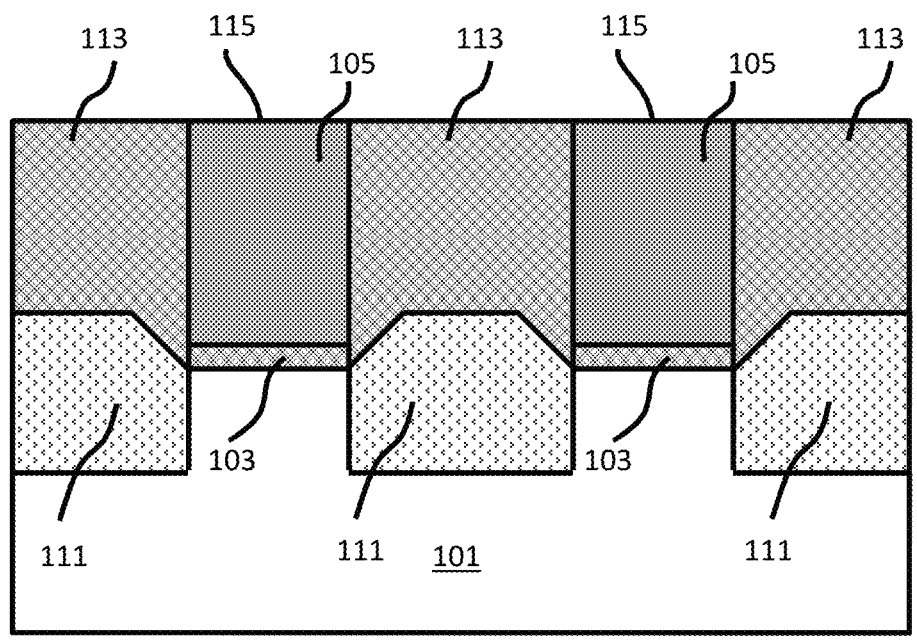

Adverting to FIG. 1G, insulator 113 is deposited and planarized. For instance, the insulator material may include a flowable oxide (FOX) or tetraethyl orthosilicate (TEOS), or high-density plasma (HDP) oxide or a combination of those. Adverting to FIG. 1H, insulator 113 is further planarized (e.g., via CMP) to expose upper surface 115 of dummy nitride layer 105.

Figure 1I:
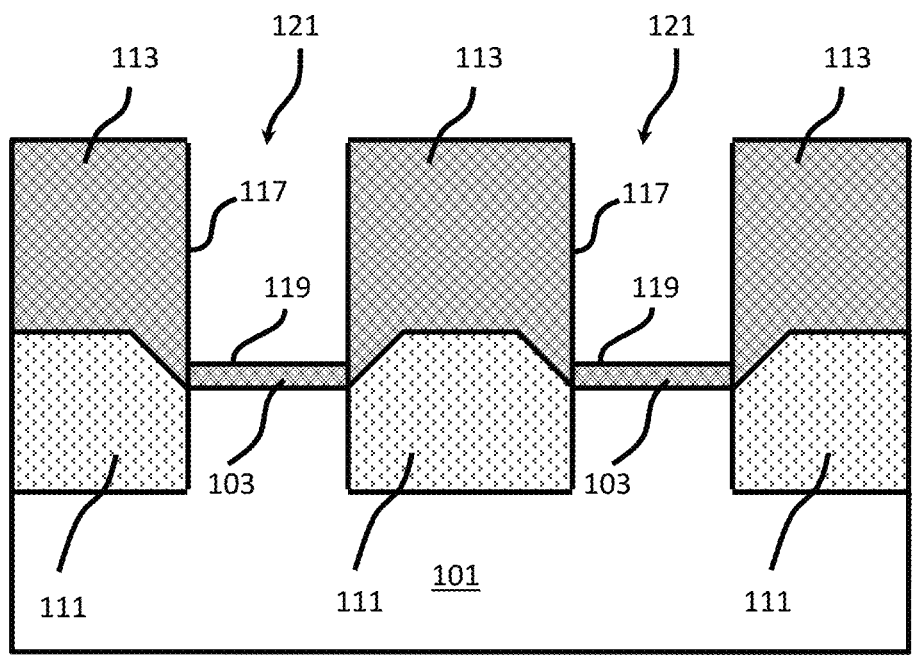

Next, dummy nitride layer 105 is removed in its entirety (FIG. 1I). The removal of dummy nitride layer 105 exposes sidewall surfaces 117 and bottom surfaces 119 of the resulting trenches 121. The removal may be performed by a RIE process or a highly selective wet etchant such as hot phosphoric acid and, therefore, prevents the undesirable loss of adjacent insulator 113 and dummy oxide layer 103. For instance, hot phosphoric acid selectively removes silicon nitride (SiN) without damaging any exposed oxide material. In this manner, dummy nitride layer 105 may be removed without degrading the shape of trenches 121.

Figure 1J:
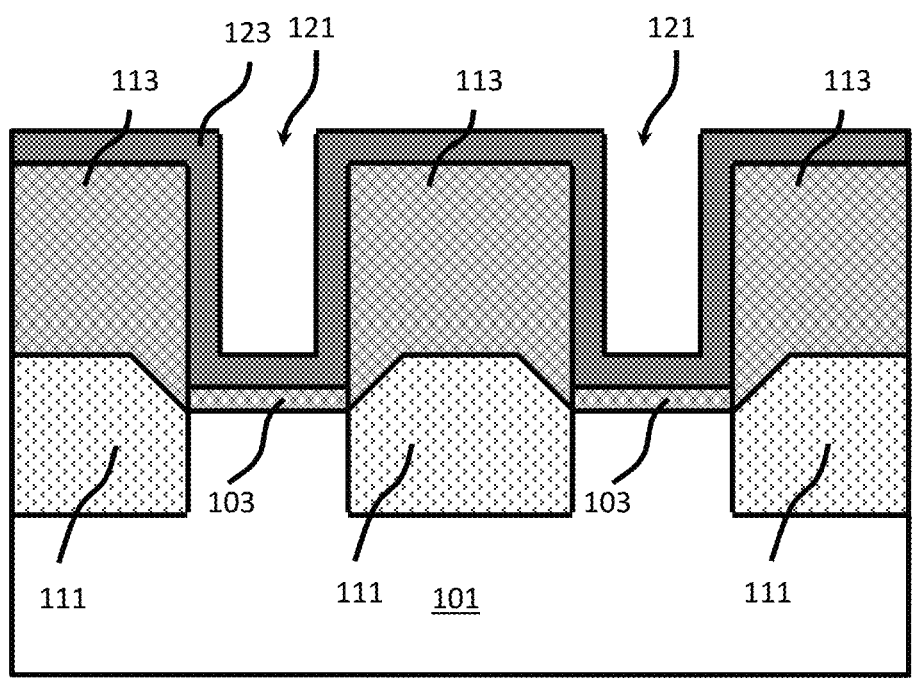
Figure 1K:
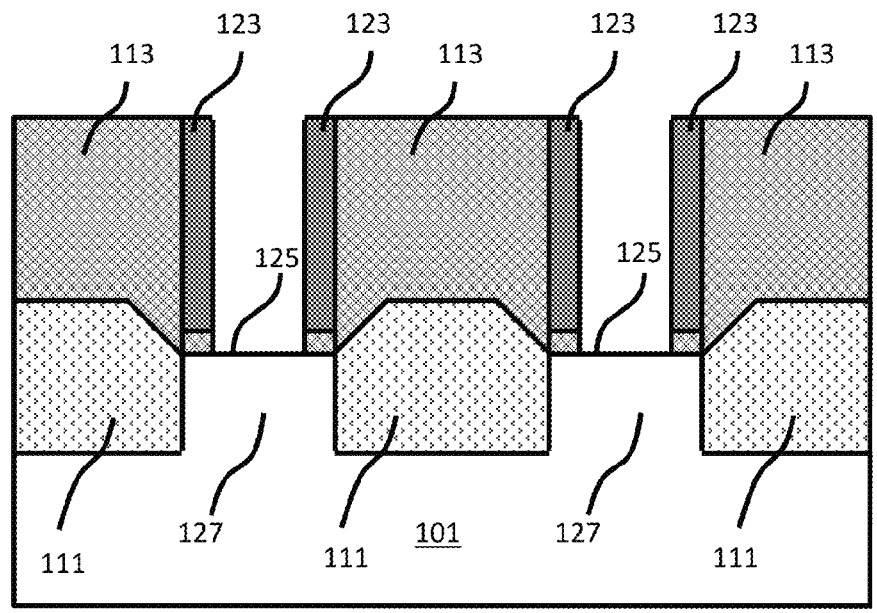
Figure 1L:
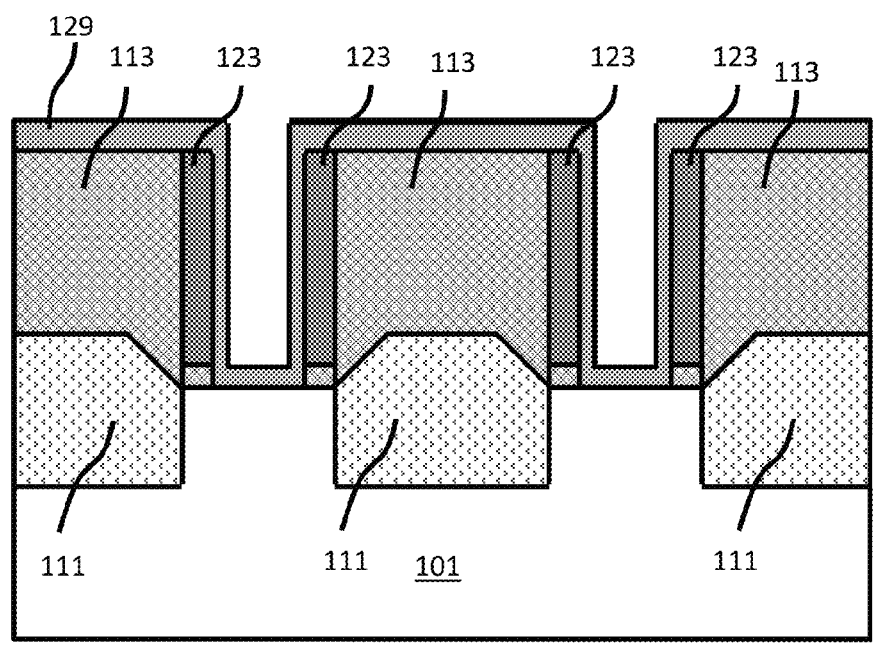
Figure 1M:
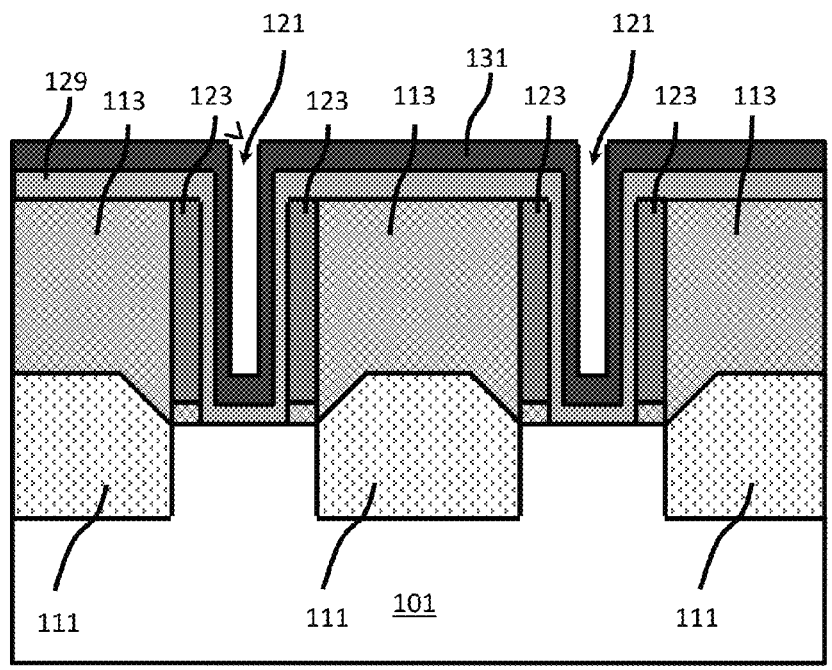
Figure 1N:
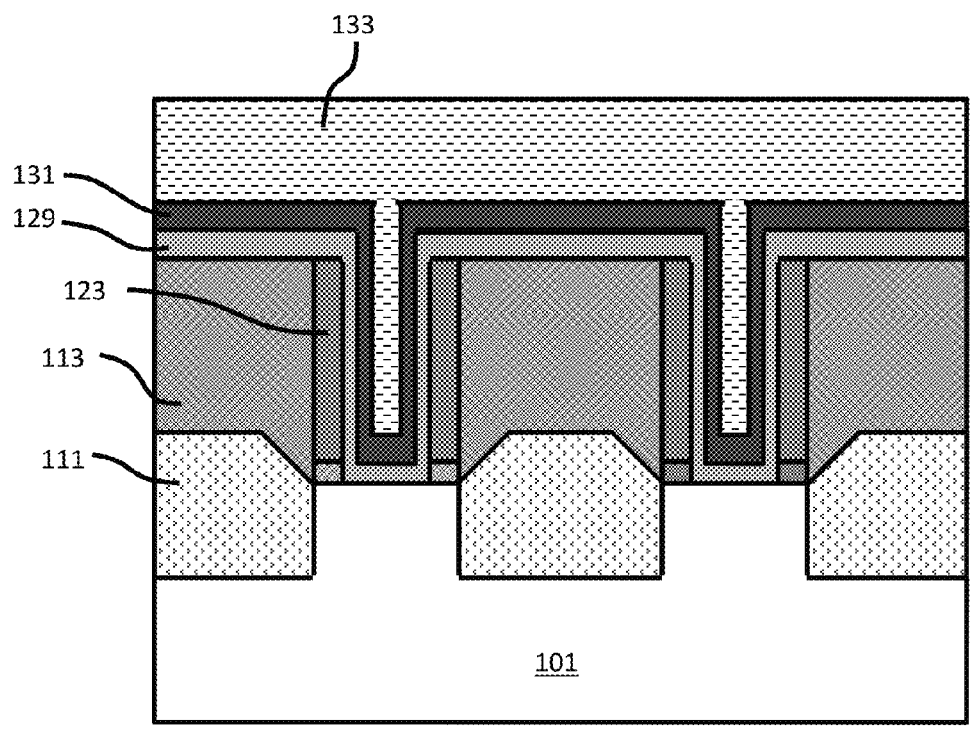
Figure 10:
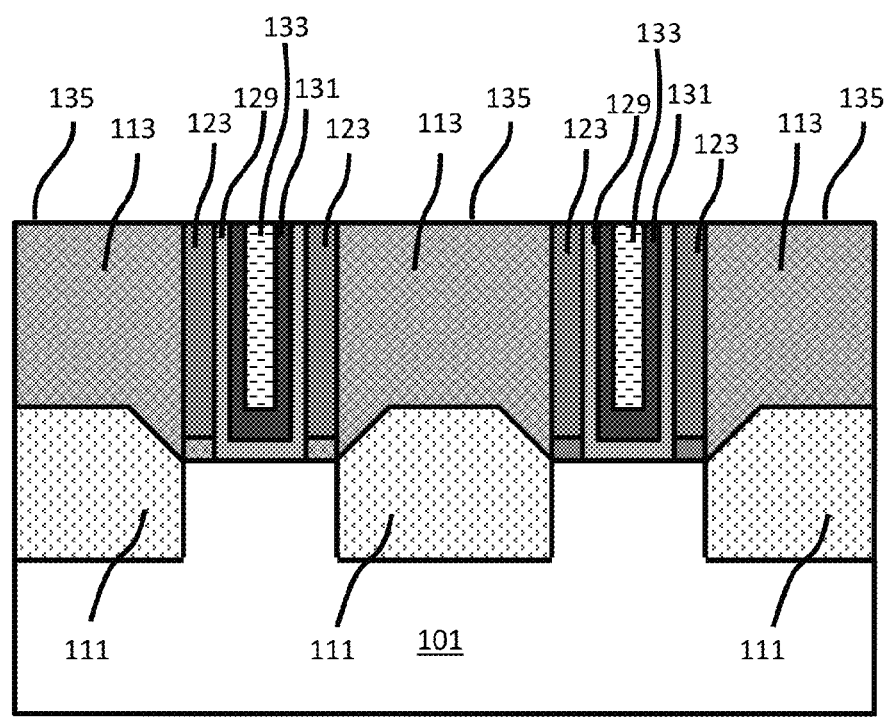

Adverting to FIG. 1J, nitride spacer layer 123 is conformally formed over insulator 113 and in trenches 121. For instance, SiN or a lower K dielectric may be deposited, e.g. to a thickness of 3 to 15 nm. Next, horizontal surfaces of nitride spacer layer 123 followed by dummy oxide layer 103 are anisotropically etched to expose surfaces 125 of channel regions 127 (FIG. 1K). The spacer etch within the trenches enables a fill-friendly profile for the subsequent HK/MG fill due to unintentional erosion of the spacer nitride top corners during the RIE process. Next, HK dielectric 129 is conformally formed over all exposed surfaces (FIG. 1L). Next, work function metal 131 is conformally formed over all exposed surfaces for example to a thickness of 1 to 5 nm (FIG. 1M). Next, gate metal 133 (e.g., tungsten (W)) is deposited over work function metal 131 and in trenches 121. Next, upper portions of HK dielectric 129, work function metal 131, and gate metal 133 are removed (e.g., by CMP). Adverting to FIG. 1O, CMP exposes upper surfaces 135 of insulator 113. Beyond this step, a standard middle-of-line (MOL) processing may be used to finalize the flow.

The embodiments of the present disclosure can achieve several technical effects, including a simplified process, improved device yield, uniform spacer dimensions, and elimination of epi nodules. The present disclosure enjoys industrial applicability associated with the designing and manufacturing of any of various types of highly integrated semiconductor devices used in microprocessors, smart phones, mobile phones, cellular handsets, set-top boxes, DVD recorders and players, automotive navigation, printers and peripherals, networking and telecom equipment, gaming systems, and digital cameras, particularly for 14 nm technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a dummy gate stack comprising a dummy nitride portion on a dummy oxide portion on a substrate;
   forming source/drain regions in the substrate at opposite sides of the dummy gate stack;
   depositing an insulating material over the source/drain regions, coplanar with the dummy gate stack; and
   replacing the dummy gate stack with a metal gate stack and spacers comprising:
      removing the dummy nitride portion of the dummy gate stack to form a trench in the deposited insulating material;
      forming the spacers on sidewall surfaces of the trench; and
      removing the dummy oxide portion of the dummy gate stack after forming the spacers.

2. The method of claim 1, comprising forming the spacers between the metal gate stack and the insulating material.

3. The method of claim 1, wherein the substrate comprises a fin for a fin field effect transistor (FINFET).

4. The method of claim 1, wherein replacing the dummy gate stack comprises removing the dummy nitride portion by reactive ion etching (RIE).

5. The method of claim 1, wherein replacing the dummy gate stack comprises removing the dummy nitride portion by a selective wet etch process employing hot phosphoric acid.

6. The method of claim 1, comprising forming the source/drain regions directly after dummy gate patterning.

7. The method of claim 1, comprising forming the dummy gate stack by:
   forming a dummy oxide layer on the substrate;
   forming a dummy nitride layer on the dummy oxide layer; and
   patterning the nitride layer and the dummy oxide layer with reactive ion etching (RIE).

8. The method of claim 7, comprising forming the dummy oxide layer to a thickness ranging from 3 to 10 nanometers (nm).

9. The method of claim 7, comprising forming the dummy nitride layer to a thickness ranging from 50 to 150 nanometers (nm).

10. The method of claim 7, wherein a critical dimension (CD) of the dummy gate stack is greater than a CD of the metal gate stack.

11. The method of claim 1, wherein replacing the dummy gate stack with the metal gate stack further comprises:
   forming a high-K (HK) dielectric layer over the spacers and a bottom surface of the trench;
   forming a work function metal layer over the HK dielectric layer; and
   depositing a gate metal in the trench.

12. A method comprising:
   forming a dummy oxide layer directly on an upper surface of a substrate;
   forming a dummy nitride layer directly on the dummy oxide layer;
   patterning the dummy nitride and dummy oxide layers to form a dummy gate stack having dummy nitride and dummy oxide portions;
   forming source/drain regions at opposite sides of the dummy gate stack; and
   replacing the dummy gate stack with a metal gate stack, comprising:
      depositing an insulating layer to cover the dummy gate stack and the source/drain regions;
      planarizing the insulating layer down to an upper surface of the nitride portion;
      removing the dummy nitride portion of the dummy gate stack to expose an upper surface of the dummy oxide portion;
      forming a trench in the insulating layer;
      conformally forming a spacer layer over the insulating layer and in the trench;
      removing the spacer layer from the upper surface of the dummy oxide portion and from an upper surface of the insulating layer, leaving spacers on side surfaces of the trench;
      removing the dummy oxide portion after leaving spacers on side surfaces of the trench.

13. The method of claim 12, comprising forming the dummy nitride layer to a thickness ranging from 50 to 150 nanometers (nm) and the dummy oxide layer to a thickness ranging from 3 to 10 nm.

14. The method of claim 12, wherein the substrate comprises a fin structure for a fin field effect transistor (FINFET).

15. The method of claim 12, comprising forming the source/drain regions by:
forming a recess in the substrate on each side of the dummy gate stack; and
epitaxially growing a silicon-based material in and over each recess.

16. The method of claim 12, wherein replacing the dummy gate stack with the metal gate stack further comprises:
forming a replacement metal gate in a remaining space of the trench.

17. The method of claim 16, comprising planarizing by chemical-mechanical polishing (CMP).

18. The method of claim 16, comprising removing the dummy nitride portion by reactive ion etching (RIE) or a selective wet etch process employing hot phosphoric acid.

19. The method of claim 16, comprising removing the spacer layer and dummy oxide portion by wet or dry etching.

20. A method comprising:
forming a dummy gate stack by:
forming a dummy oxide layer on the substrate,
forming a dummy nitride layer on the dummy oxide layer, and
patterning the nitride layer and the dummy oxide layer with reactive ion etching (RIE);
forming source/drain regions in the substrate at opposite sides of the dummy gate stack by:
forming a recess in the substrate on each side of the dummy gate stack, and
epitaxially growing a silicon-based material in and over each recess;
depositing an insulating material over the source/drain regions, coplanar with the dummy gate stack;
forming the spacers between the metal gate stack and the insulating material; and
replacing the dummy gate stack with a metal gate stack and spacers by:
removing the dummy nitride portion of the dummy gate stack to form a trench in the deposited insulating material;
forming the spacers on sidewall surfaces of the trench;
removing the dummy oxide portion of the dummy gate stack after forming the spacers on sidewall surfaces of the trench;
forming a high-K (HK) dielectric layer over the spacers and a bottom surface of the trench;
forming a work function metal layer over the HK dielectric layer; and
depositing a gate metal in the trench.

* * * * *